United States Patent
Suzuki et al.

(10) Patent No.: US 7,755,951 B2
(45) Date of Patent: Jul. 13, 2010

(54) DATA OUTPUT APPARATUS, MEMORY SYSTEM, DATA OUTPUT METHOD, AND DATA PROCESSING METHOD

(75) Inventors: Takeshi Suzuki, Tachikawa (JP); Koichi Ueda, Yokohama (JP); Tsutomu Fukatsu, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 288 days.

(21) Appl. No.: 11/840,912

(22) Filed: Aug. 17, 2007

(65) Prior Publication Data

US 2008/0056017 A1 Mar. 6, 2008

(30) Foreign Application Priority Data

Sep. 1, 2006 (JP) .............................. 2006-237727
Oct. 18, 2006 (JP) .............................. 2006-284141

(51) Int. Cl.
*G11C 7/10* (2006.01)
(52) U.S. Cl. ............................................. 365/189.05
(58) Field of Classification Search ............ 365/189.05; 711/105
See application file for complete search history.

(56) References Cited

U.S. PATENT DOCUMENTS

| | | | |
|---|---|---|---|
| 6,134,180 A * | 10/2000 | Kim et al. ............... | 365/233.16 |
| 6,151,036 A | 11/2000 | Nakajima et al. ........... | 345/511 |
| 6,871,272 B2 | 3/2005 | Butterworth | |
| 7,065,263 B2 | 6/2006 | Ueda .......................... | 382/298 |
| 7,286,720 B2 | 10/2007 | Ueda .......................... | 382/298 |
| 2005/0152210 A1* | 7/2005 | Park et al. .................... | 365/233 |
| 2006/0069925 A1 | 3/2006 | Nakai et al. | |

FOREIGN PATENT DOCUMENTS

| | | |
|---|---|---|
| CN | 1374659 A | 10/2002 |
| CN | 1650571 A | 8/2005 |
| JP | 8-55481 | 2/1996 |
| JP | 2004-213563 | 7/2004 |
| JP | 2006-238315 | 9/2006 |

OTHER PUBLICATIONS

Chinese Office Action dated Mar. 6, 2009 in corresponding Chinese Patent Application No. 200710147678.2.

* cited by examiner

*Primary Examiner*—Hoai V Ho
*Assistant Examiner*—Jay Radke
(74) *Attorney, Agent, or Firm*—Fitzpatrick, Cella, Harper & Scinto (57) ABSTRACT

A data output apparatus converts input data into data that changes less than the input data, and outputs the converted data to a memory.

9 Claims, 12 Drawing Sheets

| WRITE DATA | | BURST 0 | BURST 1 | BURST 2 | BURST 3 | SWITCHING COUNT | ENCODING |
|---|---|---|---|---|---|---|---|
| | 0→1→2→3 | FF | 0F | F0 | FF | | |
| SORTING 0 | | FF →4bit→ 0F →8bit→ F0 →4bit→ FF | | | | 16bit | 0000 |
| SORTING 1 | 1→0→3→2 | 0F →4bit→ FF →0bit→ FF →4bit→ F0 | | | | 8bit | 0011 |
| SORTING 2 | 3→0→1→2 | FF →0bit→ FF →4bit→ 0F →8bit→ F0 | | | | 12bit | 1111 |

| WRITE DATA | BURST 0 | BURST 1 | BURST 2 | BURST 3 | ENCODING |
|---|---|---|---|---|---|
| PATTERN 0 | 00 | FF | 00 | FF | 0001 |
| PATTERN 1 | FF | 00 | FF | 00 | 0010 |
| PATTERN n | | | | | |
| NO MATCH | | | | | 0000 |

DATA OUTPUT APPARATUS, MEMORY SYSTEM, DATA OUTPUT METHOD, AND DATA PROCESSING METHOD

BACKGROUND OF THE INVENTION

1. Field of the Invention

The present invention relates to a data output apparatus and method of outputting data to a memory, a memory system having a memory device and memory controller, and a data processing method of the memory device in the memory system.

2. Description of the Related Art

Recently, the improvement of the semiconductor process has dramatically increased the integration degree and operating frequency of an LSI, and the performance of an apparatus using this LSI has also increased. The increase in operating frequency has also increased the electromagnetic radiation of an LSI, and makes it difficult to control EMI (Electro Magnetic Interference). When the operating frequency of an LSI rises, the amount of harmonic components at high frequencies contained in a clock signal increases, and this increases the radiation of the harmonic components.

An SSCG (Spread Spectrum Clock Generator) is used to control the EMI. The SSCG oscillates (modulates) the clock frequency of an LSI by slightly changing the frequency, thereby lowering the peak of the EMI.

As the operating frequency of an LSI increases, it is becoming important to ensure the quality of a signal, i.e., so-called signal integrity.

When a transistor on an LSI chip switches, a high-frequency electric current flows through a power supply/ground line and generates noise on it. This is so-called power bounce or ground bounce.

This noise increases in proportion to the number of transistors that switch. A large power bounce or ground bounce produced when a large number of transistors integrated on an LSI chip simultaneously switch is called SSO (Simultaneous Switching Output) noise.

The noise increases as the operating frequency and integration degree of an LSI increase. On the other hand, the noise margin decreases as the power supply voltage of an LSI lowers and its operating frequency increases. This makes it important to control the noise.

Japanese Patent Laid-Open No. 2004-213563 has proposed a memory access signal generator as the technique that effectively reduces the noise and EMI as described above.

In this memory access signal generator described in Japanese Patent Laid-Open No. 2004-213563, when the transition of a digital signal is detected and the signal is delayed, control is performed so as not to delay a digital signal in the next stage that has simultaneously detected the transition. In addition, control is performed so as to delay the digital signal in the next stage that has simultaneously detected the transition, thereby always controlling the number of simultaneous switching actions generated by a digital signal such as an address signal or data signal to ½. This makes it possible to appropriately reduce the power consumption, noise, and EMI.

Unfortunately, the memory access signal generator described in Japanese Patent Laid-Open No. 2004-213563 has the problem that if the number of times of data switching increases, noise increases, and the noise decreases the operation margin.

SUMMARY OF THE INVENTION

The present invention provides a technique that reduces noise when writing data in a memory or reading out data from a memory.

According to one aspect of the present invention, there is provided a data output apparatus for outputting data to a memory, comprising a conversion unit configured to convert input data into data which changes less than the input data, and an output unit configured to output the data converted by the conversion unit to the memory.

According to another aspect of the present invention, there is provided a memory system having a memory device and a memory controller, the memory controller comprising a first conversion unit configured to convert input data into data which changes less than the input data, and a first output unit configured to output the data converted by the first conversion unit to the memory device, and the memory device comprising a first restoration unit configured to restore the data before conversion by the first conversion unit from the data output from the first output unit, and a write unit configured to write the data restored by the first restoration unit into a memory cell.

According to still another aspect of the present invention, there is provided a data output apparatus for outputting data to a memory, comprising a sort unit configured to sort input data in an order corresponding to the input data, and an output unit configured to output, to the memory, the data sorted by the sort unit and control data for restoring the input data sorted by the sort unit to the original sequence the input data was in before the sorting.

According to still yet another aspect of the present invention, there is provided a data output apparatus for outputting data to a memory, comprising a conversion unit configured to convert predetermined input data, and an output unit configured to output, to the memory, the predetermined input data converted by the conversion unit, and identification data indicating that the predetermined data is converted by the conversion unit.

According to yet still another aspect of the present invention, there is provided a memory system having a memory device and a memory controller, the memory controller comprising a first conversion unit configured to convert predetermined input data, and a first output unit configured to output, to the memory device, the predetermined input data converted by the first conversion unit, and first identification data indicating that the predetermined data is converted by the first conversion unit, and the memory device comprising a first restoration unit configured to restore the data before conversion by the conversion unit from the data output from the first output unit, and a write unit configured to write the data restored by the first restoration unit into a memory cell.

According to still yet another aspect of the present invention, there is provided a data output method of outputting data to a memory, comprising a conversion step of converting input data into data which changes less than the input data, and an output step of outputting the data converted in the conversion step to the memory.

According to yet still another aspect of the present invention, there is provided a data processing method of a memory device in a memory system having the memory device and a memory controller, wherein the memory controller executes a first conversion step of converting input data into data which changes less than the input data, and a first output step of outputting the data converted in the first conversion step to the memory device, and the memory device executes a first restoration step of restoring the data before conversion in the first conversion step from the data output in the first output step, and a write step of writing the data restored in the first restoration step into a memory cell.

According to still yet another aspect of the present invention, there is provided a data output method of outputting data to a memory, comprising a sorting step of sorting input data in an order corresponding to the input data, and an output step of outputting, to the memory, the data sorted in the sorting step, and control data for restoring the data before sorting from the data sorted in the sorting step.

According to yet still another aspect of the present invention, there is provided a data output method of outputting data to a memory, comprising a conversion step of converting predetermined input data, and an output step of outputting, to the memory, the predetermined input data converted in the conversion step, and identification data indicating that the predetermined data is converted in the conversion step.

According to still yet another aspect of the present invention, there is provided a data processing method of a memory device in a memory system having the memory device and a memory controller, wherein the memory controller executes a first conversion step of converting predetermined input data, and a first output step of outputting, to the memory device, the predetermined input data converted in the first conversion step, and first identification data indicating that the predetermined data is converted in the first conversion step, and the memory device executes a first restoration step of restoring the data before conversion in the first conversion step from the data output in the first output step, and a write step of writing the data restored in the first restoration step into a memory cell.

Further features of the present invention will become apparent from the following description of exemplary embodiments with reference to the attached drawings.

DESCRIPTION OF THE EMBODIMENTS

First Embodiment

Embodiments of the present invention will be explained in detail below with reference to the accompanying drawings. Note that the following embodiments do not limit the present invention according to the scope of claims. Note also that not all combinations of features explained in the embodiments are essential to the means of the present invention.

First, a memory system according to the first embodiment of the present invention will be explained.

Figure 1:
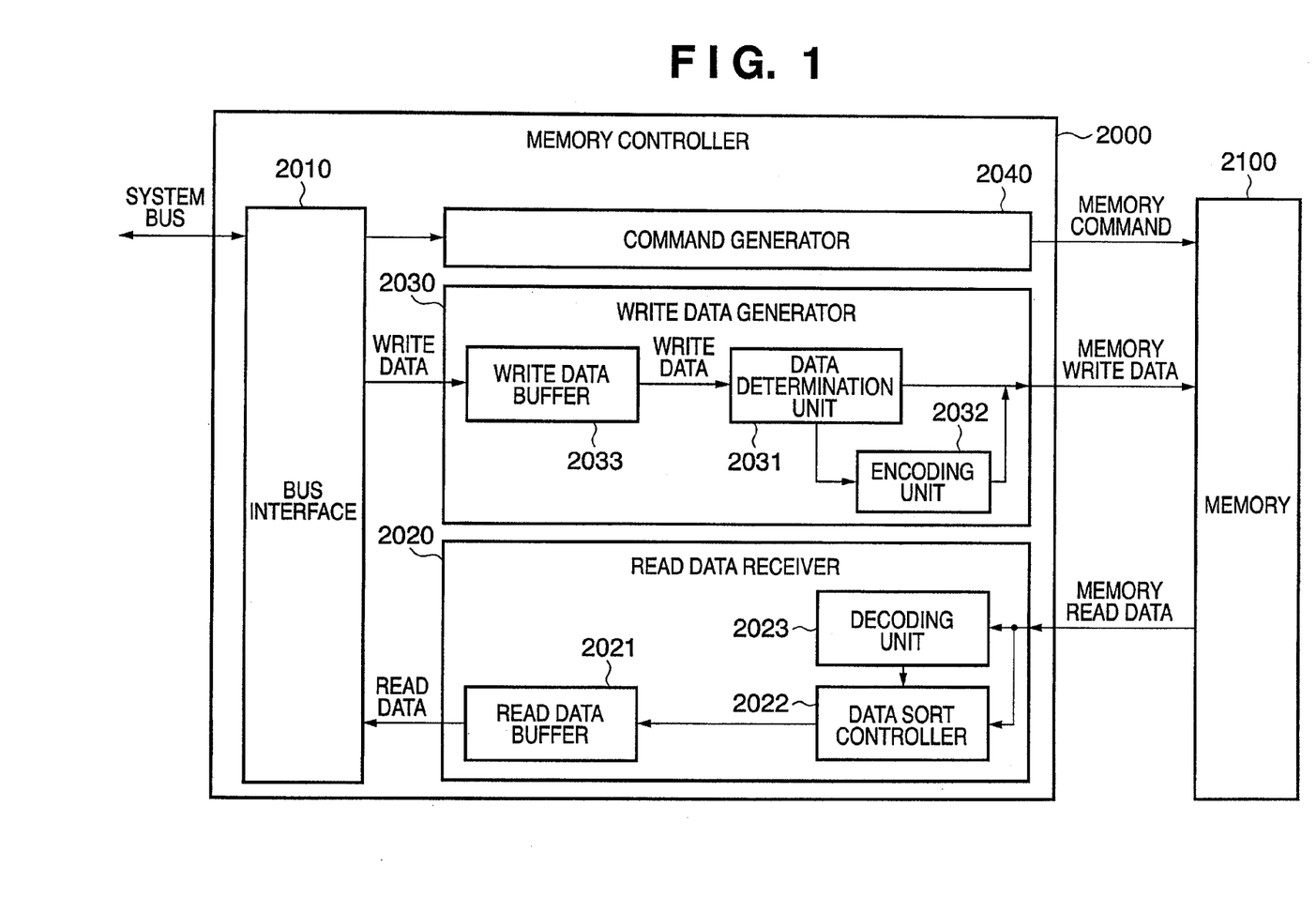
FIG. 1 is a block diagram showing the arrangement of the first embodiment of a memory controller of the present invention.

FIG. 1 shows the memory system according to this embodiment.

In FIG. 1, reference numeral 2000 denotes a memory controller; and 2100, a memory. The memory controller 2000 includes a bus interface 2010, command generator 2040, write data generator 2030, and read data receiver 2020.

The write data generator 2030 comprises a write data buffer 2033, data determination unit 2031, and encoding unit 2032. The read data receiver 2020 comprises a read data buffer 2021, data sort controller 2022, and decoding unit 2023.

The memory controller 2000 having received a write request from a system bus generates a command and write data in accordance with a bus protocol by using the bus interface 2010. The memory controller 2000 transmits the command to the command generator 2040, and the write data to the write data generator 2030.

The command generator 2040 converts the received command into a memory command. The write data generator 2030 writes the received write data in the write data buffer 2033. The data determination unit 2031 determines the sorting order of the write data written in the write data buffer 2033. The encoding unit 2032 encodes the determination result from the data determination unit 2031. The write data generator 2030 then generates memory write data to be written in the memory 2100, on the basis of the output results from the data determination unit 2031 and encoding unit 2032.

On the other hand, when reading out data, the data sort controller 2022 sorts the data on the basis of the decoding result from the decoding unit 2023. The read data buffer 2021 holds the sorted data, and transmits the read data to the system bus via the bus interface 2010.

Figure 2:
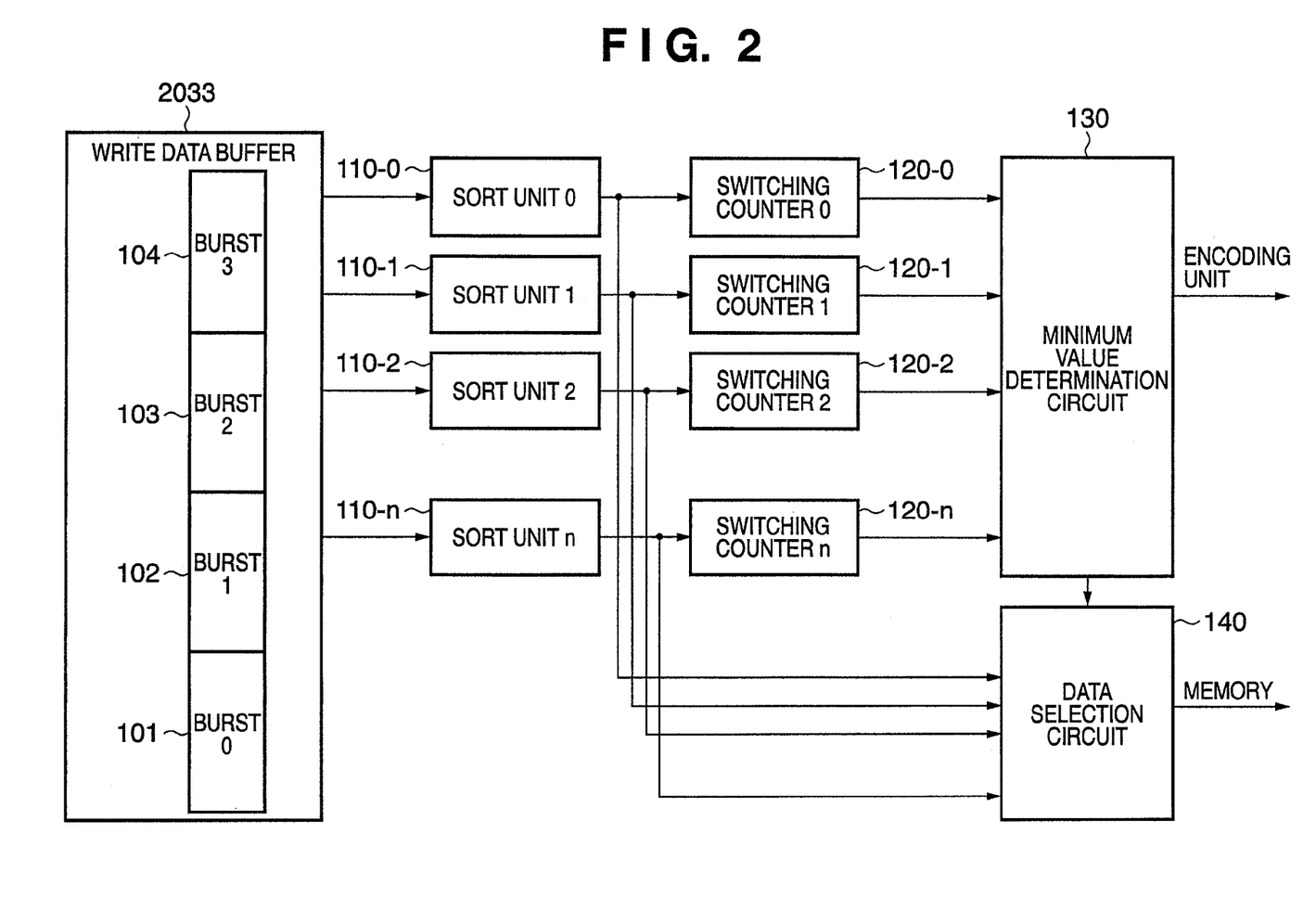
FIG. 2 is a block diagram showing the arrangement of a data determination unit of the first embodiment.

The data determination unit 2031 will be explained below with reference to FIG. 2.

The data determination unit 2031 of this embodiment comprises data sort units 0 (110-0) to n (110-n), data switching counters 0 (120-0) to n (120-n), a minimum value determination circuit 130, a data selection circuit 140, and the like.

This embodiment will be explained using a burst length of four. Write data in the write data buffer 2033 is divided into bursts 0 (101) to 3 (104). The data sort units 0 (110-0) to n (110-n) sort data of the bursts 0 (101) to 3 (104) on the basis of individual sorting patterns.

The switching counters 0 (120-0) to n (120-n) receive the sorted data, and output the switching counts of the individual data patterns. The minimum value determination circuit 130 determines the minimum value of the outputs from the data switching counters 0 (120-0) to n (120-n), and outputs the determination result to the encoding unit 2032 and data selection circuit 140. The data selection circuit 140 outputs the selection result as a part of the memory write data.

Figure 3:
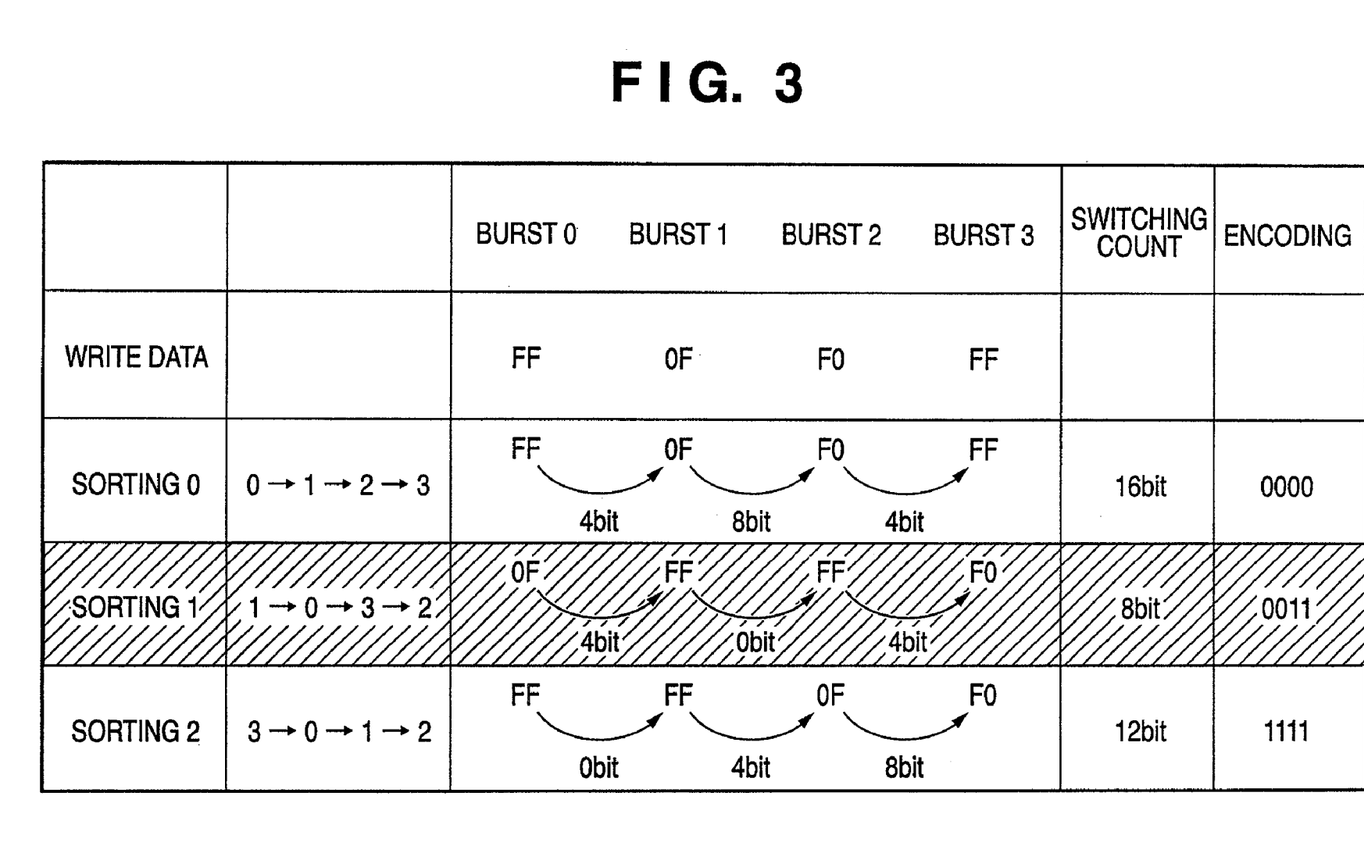
FIG. 3 is a view showing a data sequence switching example in the first embodiment.

A practical example of data sort by the data sort units 110-1 to 110-n will be described below with reference to FIG. 3. This embodiment will be explained using a burst length of four and a data width of eight bits, and taking write data "FF→0F→F0→FF" (in hex base 16) as an example.

In the case of sort 0 (0→1→2→3, data is not sorted) performed by the data sort unit 110-0, four bits of data are switched between bursts 0 and 1, eight bits of data are switched between bursts 1 and 2, and four bits of data are switched between bursts 2 and 3. That is, FF changes to 0F (F→0) between bursts 0 and 1, so four bits change. Collectively, 16-bit data switching occurs in one burst.

In the case of sort 1 (sort is performed in the order of burst 1→burst 0→burst 3→burst 2) performed by the data sort unit 110-1, four bits, zero bit, and four bits of data are switched between the individual bursts, so a total of eight bits are switched. Similarly, in the case of sort 2 performed by the data sort unit 110-2, 12 bits are switched.

The minimum value determination circuit 130 determines that the pattern of sort 1 of the data sort operations performed by the data sort units 110-0 to 110-2 minimizes the data switching count. The encoding unit 2032 appends, to the memory write data, "0011" obtained by encoding this data sort result.

Figure 4A:
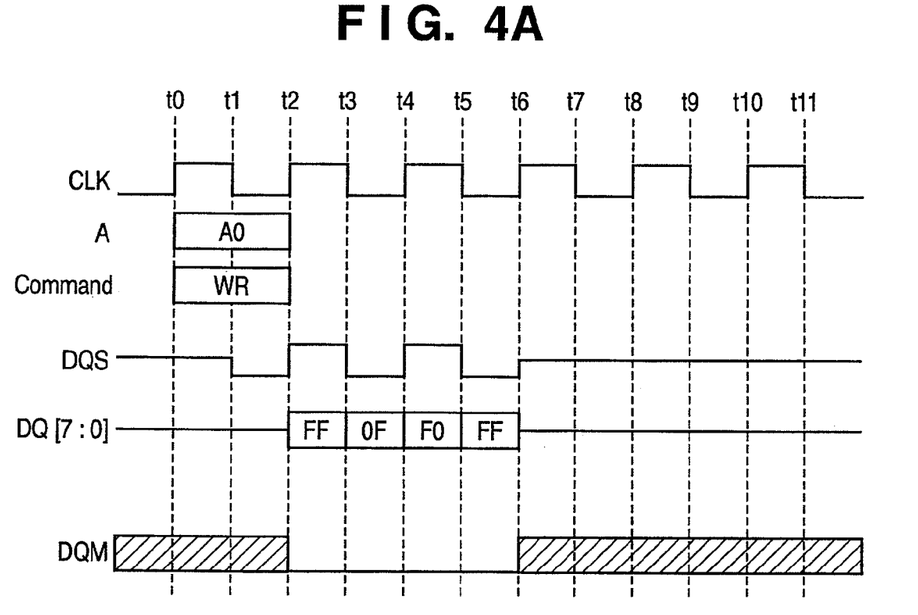
FIGS. 4A and 4B are timing charts showing the operation timings of a memory interface when writing data in the first embodiment.
Figure 4B:
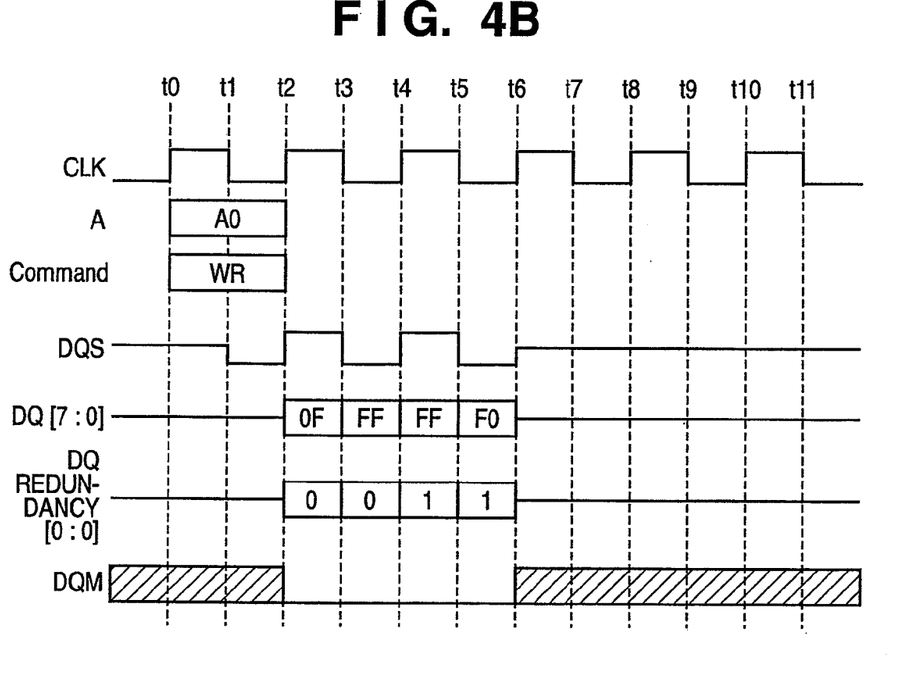

FIGS. 4A and 4B show examples of timing charts. In FIGS. 4A and 4B, reference symbol CLK denotes a clock; A, an address; DQS, a data strobe; DQ, a data signal; and DQM, a data mask signal. In a comparative example (to which this embodiment is not applied) shown in FIG. 4A, the write data is directly output to DQ. By contrast, this embodiment shown in FIG. 4B transmits the encoding result using DQ redundancy bits, and transfers the data sort result by normal DQ.

This makes it possible to reduce the number of times of data switching performed during memory read and write, thereby reducing the EMI noise and SSO noise. It is also possible to reduce the power consumed by memory read and write by reducing the number of times of switching.

Figure 10:
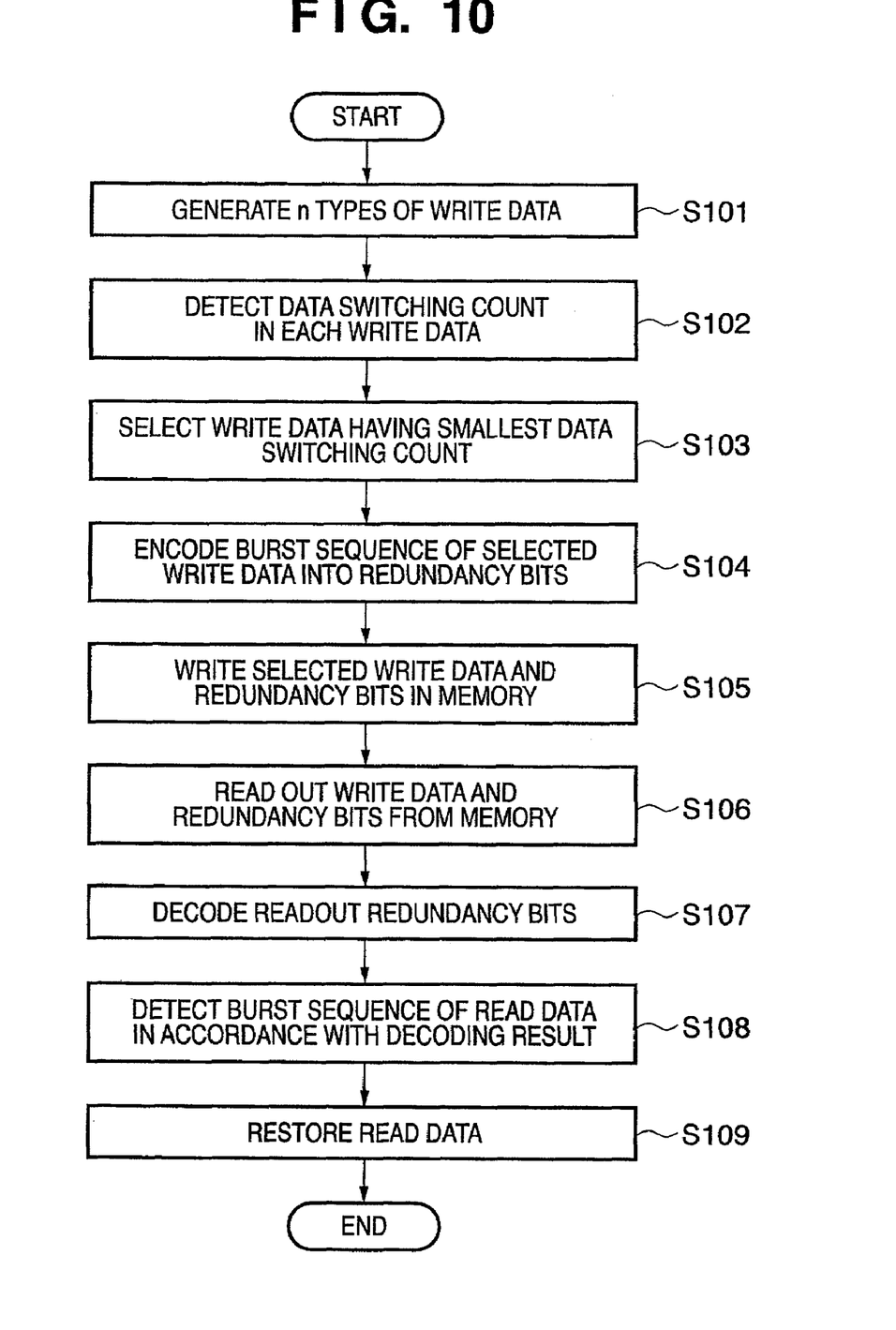
FIG. 10 is a flowchart for explaining an example of a procedure when writing data in the memory and reading out data from the memory.

An example of the memory control procedure will be explained below with reference to FIG. 10.

First, in step S101, the data sort units 110-0 to 110-n generate n types of write data by sorting the burst sequence of write data in the write data buffer 2033.

Then, in step S102, the data switching counters 120-0 to 120-n detect the counts of data pattern switching in the individual write data. In step S103, the minimum value determination circuit 130 and data selection circuit 140 select write data having a minimum data switching count. In the example shown in FIG. 3, the data selection circuit 140 selects the output from the data sort unit 110-2, and outputs the signal as DQ[7:0] shown in FIG. 4B.

In step S104, the encoding unit 2032 encodes the burst sequence of the write data selected in step S103 into redundancy bits. This encoding is done using, e.g., four bits as described above. The encoded redundancy bits are appended to the write data. As shown in FIG. 4B, the encoding unit 2032 outputs the encoding result as redundancy bits DQ[0:0]. Subsequently, in step S105, the selected write data and encoded redundancy bits are written in the memory 2100.

The process then advances to step S106 to read out the write data and redundancy bits written in the memory 2100 as described above. The process advances to step S107, and the decoding unit 2023 decodes the readout redundancy bits. The process advances to step S108 to detect the burst sequence of the read data read out from the memory 2100, in accordance with the result of decoding performed in step S107. In the example shown in FIG. 3, the decoding unit 2023 determines by decoding "0011" that the burst sequence is sort 1, and sorts "0FFFFFF0" into "FF0FF0FF".

Subsequently, the process advances to step S109, and the data sort controller 2022 sorts the burst sequence of the read data read out from the memory 2100, in accordance with the burst sequence detection result, thereby restoring the read data so as to obtain the burst sequence before sort.

As described above, the memory control method of this embodiment generates write data by sorting the burst sequence so as to minimize the data switching count when writing the data in the memory 2100. This makes it possible to reduce noise when writing data in the memory 2100 and reading out data from the memory 2100.

Second Embodiment

A memory system according to the second embodiment of the present invention will be explained below.

Figure 5:
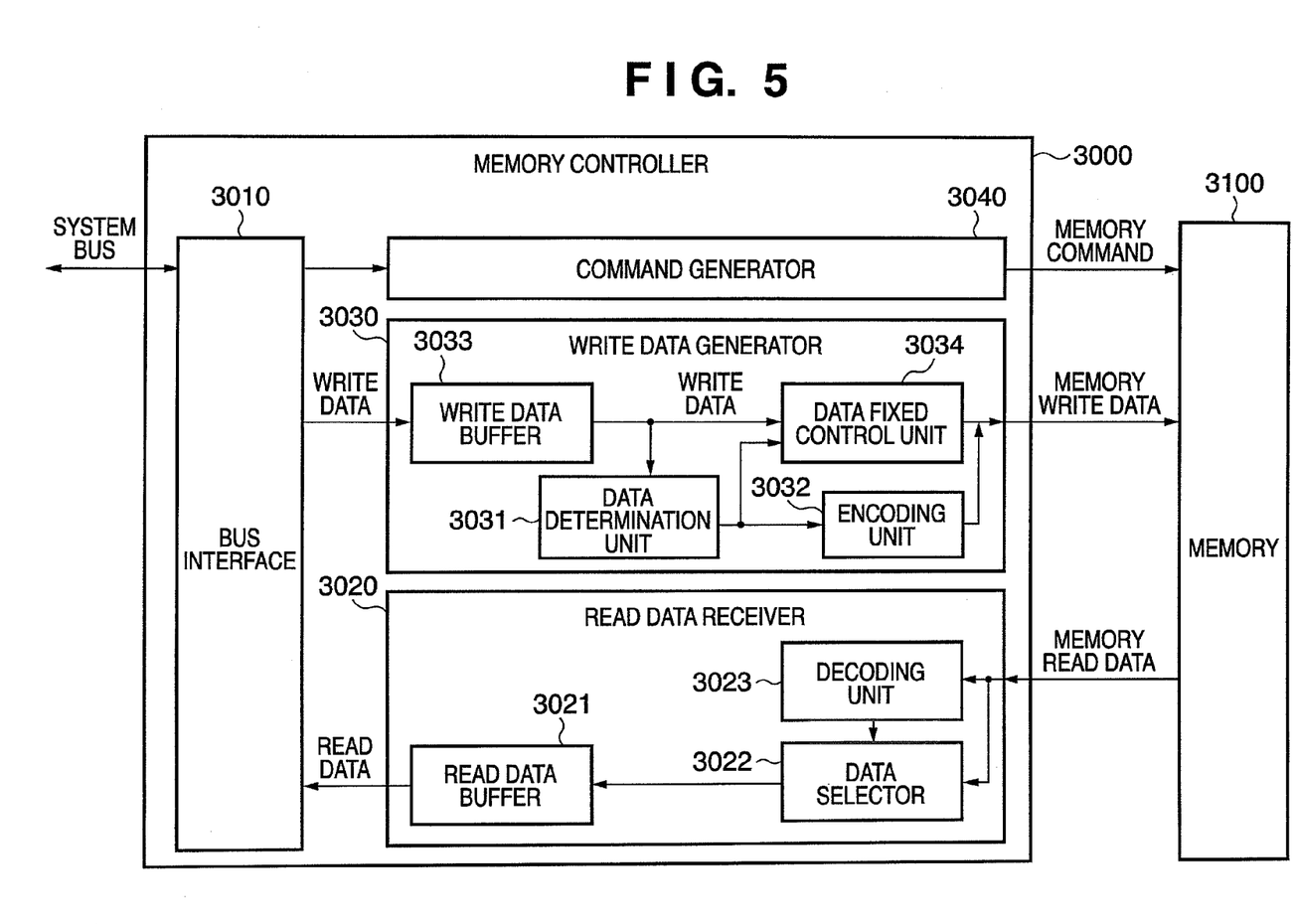
FIG. 5 is a block diagram showing the arrangement of the second embodiment of the memory controller of the present invention.

FIG. 5 shows the memory system according to this embodiment.

Reference numeral 3000 denotes a memory controller; and 3100, a memory. The memory controller 3000 includes a bus interface 3010, command generator 3040, write data generator 3030, read data receiver 3020, and the like.

The write data generator 3030 includes a write data buffer 3033, data determination unit 3031, encoding unit 3032, data fixed control unit 3034, and the like. The read data receiver 3020 includes a read data buffer 3021, data selector 3022, decoding unit 3023, and the like.

The memory controller 3000 having received a write request from a system bus generates a command and write data in accordance with a bus protocol using the bus interface 3010. The memory controller 3000 transmits the command to the command generator 3040, and the write data to the write data generator 3030.

The command generator 3040 converts the received command into a memory command. The write data generator 3030 writes the received write data in the write data buffer 3033. The data determination unit 3031 determines whether or not the write data in the write data buffer 3033 matches a specific pattern. The encoding unit 3032 encodes the determination result from the data determination unit 3031.

The data fixed control unit 3034 fixes data to be written in the memory 3100 in accordance with the data determination unit 3031. Memory write data is generated on the basis of the output results from the data fixed control unit 3034 and encoding unit 3032.

When performing data read, the decoding unit 3023 decodes memory read data and determines whether the data matches a specific pattern. If the data matches the specific pattern, the data selector 3022 changes the read data into the specific pattern, and transmits the pattern to the read data buffer 3021. The read data buffer 3021 holds the sorted data, and transmits the read data to the system bus via the bus interface 3010.

The data determination unit 3031 will be explained below with reference to FIG. 6.

The data determination unit 3031 includes n data comparison circuits 210-0 to 210-n, a data pattern holding circuit 220, data hit flag generator 230, and the like. This embodiment will be explained using a burst length of four.

Write data in the write data buffer 3033 can be divided into bursts 0 (201) to 3 (204) each of which is 8-bit data. The data comparison circuits 210-0 to 210-n compare the data of bursts 0 to 3 with data patterns.

The data comparison circuits 210-0 to 210-n compare bursts 0 to 3 with n patterns. If data matches a certain pattern, "1" is set in a corresponding hit signal. The data comparison results are transmitted to the encoding unit 3032, and encoded. The data hit flag generator 230 generates a hit flag by performing an arithmetic operation on the comparison results, and transmits the hit flag to the data fixed control unit 3034.

If the hit flag is "1", the data fixed control unit 3034 fixes the write data. If not, the data fixed control unit 3034 directly outputs the write data as a part of memory write data to the memory 3100.

An example of a practical procedure of fixing data will be explained below with reference to FIG. 7. This embodiment will be explained using a burst length of four and a data width of eight bits.

First, the data comparison circuits 210-0 to 210-n compare write data with patterns 0 to n. As shown in FIG. 7, write data "FF, 00, FF, 00" matches pattern 1. Therefore, the data determination unit 3031 sets "1" in hit 1 (the output from the data comparison circuit 210-1) and in the hit flag (the output from the data hit flag generator 230). Likewise, as shown in FIG. 7, the encoding unit 3032 encodes the outputs from the data comparison circuits 210-1 to 210-n into "0010".

Also, since the hit flag is "1", the data fixed control unit 3034 transmits the data as noise-reduction data fixed to "0" to the memory 3100. Note that patterns 0 to n held in the data pattern holding circuit 220 are patterns having large data switching counts.

Write data "00, 01, 02, 03" does not match any output pattern from the data pattern holding circuit 220. In this case, the data determination unit 3031 outputs "0" as the hit flag and all the hit outputs. In this case, the encoding unit 3032 outputs "0000", and the data fixed control unit 3034 directly outputs the write data as memory write data to the memory 3100.

Figure 8A:
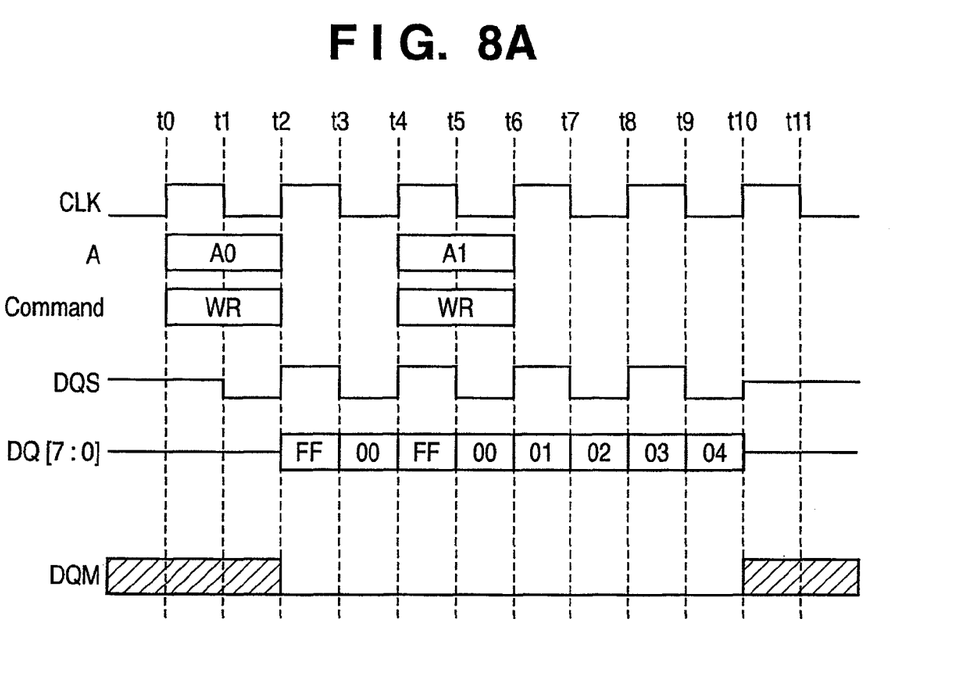
FIGS. 8A and 8B are timing charts showing the operation timings of a memory interface when writing data in the second embodiment.
Figure 8B:
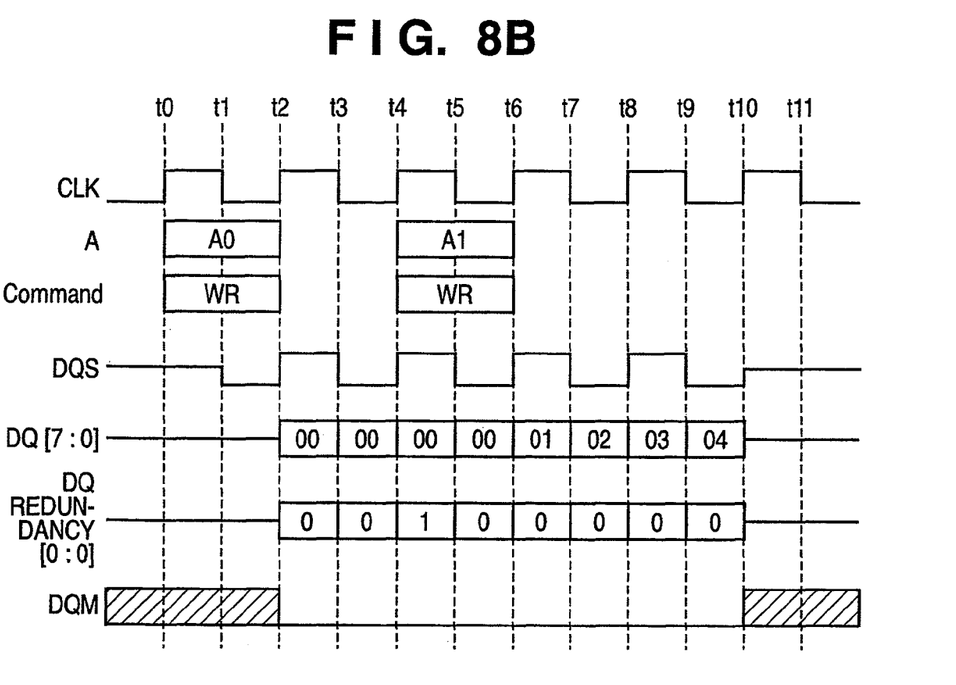

FIGS. 8A and 8B are timing charts. In a comparison example (to which this embodiment is not applied) shown in FIG. 8A, write data is directly output to DQ. By contrast, this embodiment shown in FIG. 8B transmits the encoding result by using DQ redundancy bits, and transfers the data fixing result by normal DQ. When writing data in A0, the data matches the access pattern, so DQ[7:0] is fixed to "0", and the encoding result "0010" is transmitted to the DQ redundancy bits. When writing data in A1, the data does not match the access pattern, so the write data is directly output to DQ[7:0], and the DQ redundancy bits are "0000".

Figure 9:
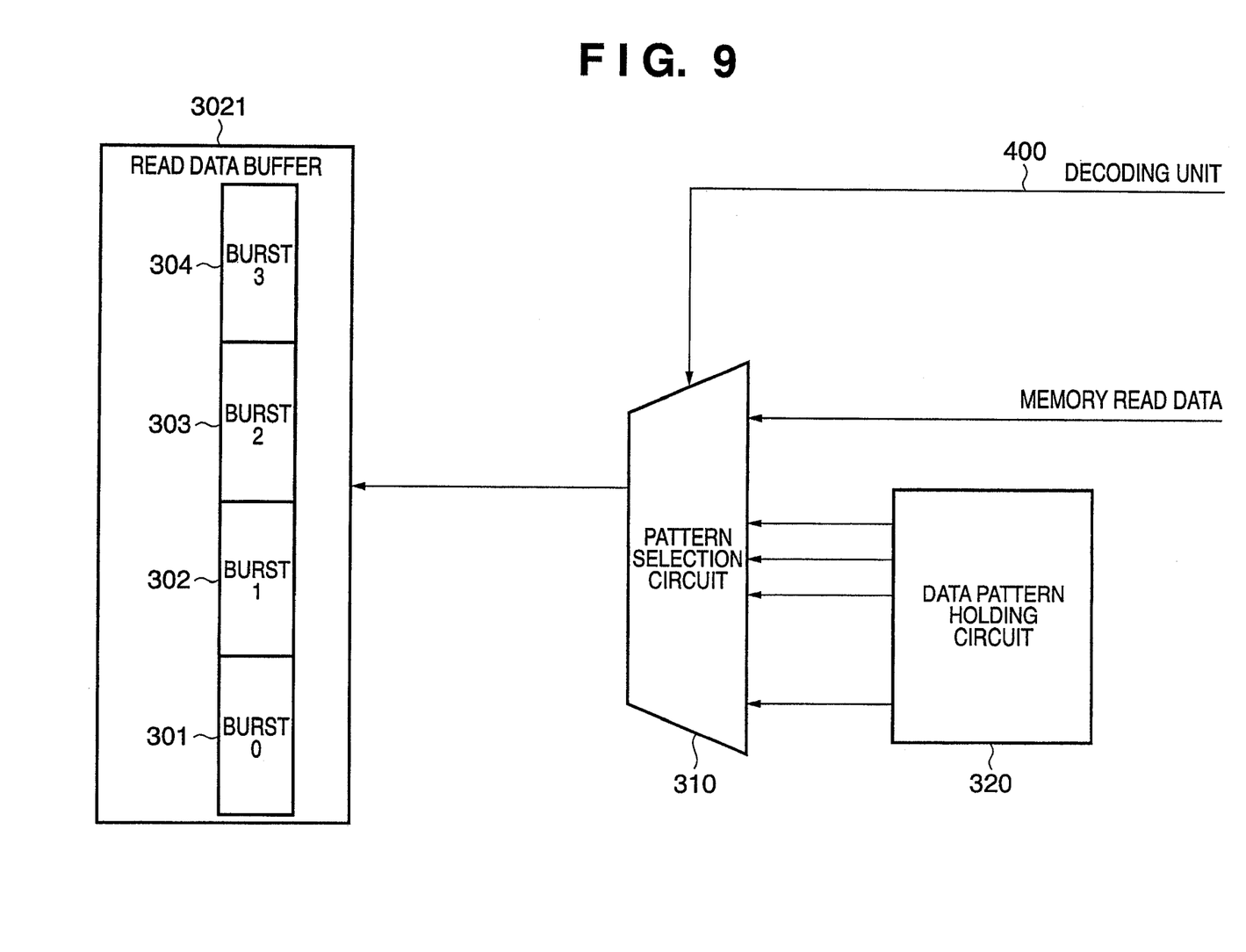
FIG. 9 is a block diagram showing the arrangement of a read data restoration circuit in the second embodiment.

The data selector 3022 will be explained below with reference to FIG. 9.

The data selector 3022 includes a pattern selection circuit 310 and data pattern holding circuit 320. Reference numerals 301 to 304 denote burst data held in the read data buffer 3021.

The pattern selection circuit 310 selectively outputs a pattern held in the data pattern holding circuit 320 or received data in accordance with a selection signal 400 from the decoding unit 3023. The data pattern holding circuit 320 is holding specific data patterns, i.e., the same data patterns as in the data pattern holding circuit 220 in this embodiment.

Although this embodiment uses the data pattern holding circuits 220 and 320 for read and write, respectively, one data pattern holding circuit may also be used because the same data is held for both read and write.

Figure 7:
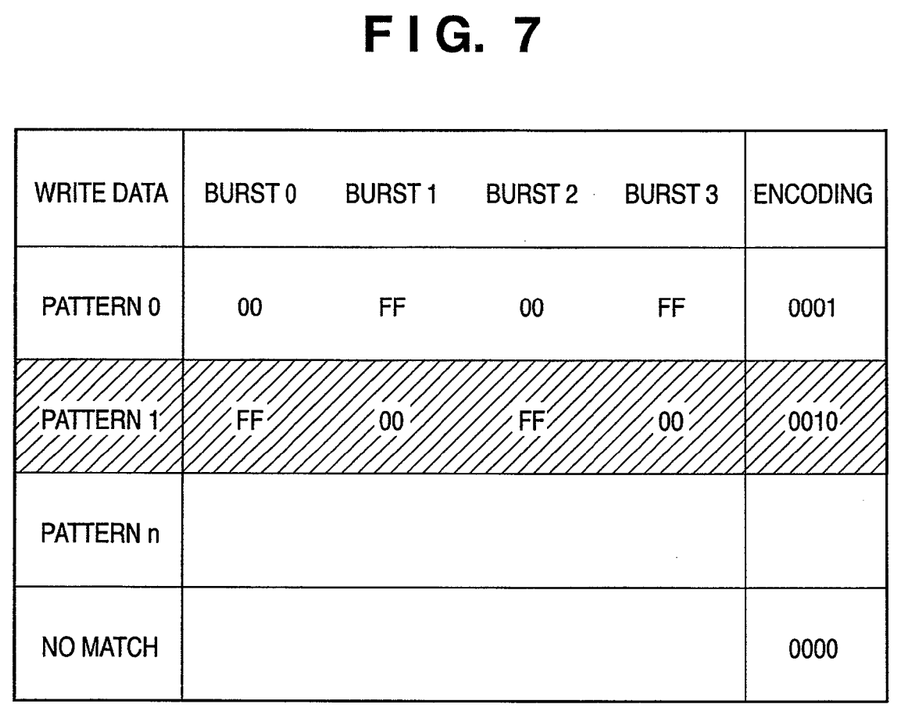
FIG. 7 is a view showing a data pattern comparison example in the second embodiment.

When the DQ redundancy bits are "0000", the data does not match any specific pattern as shown in FIG. 7, so the memory read data is directly output to the read data buffer 3021. If data matches a specific pattern, data from the data pattern holding circuit 320 is selected in accordance with the decoding result.

The memory system of this embodiment using the procedure explained above can reduce the number of times of data switching, thereby reducing noise produced by data switching when writing data in and reading out data from a memory chip and memory module.

Third Embodiment

Figure 11:
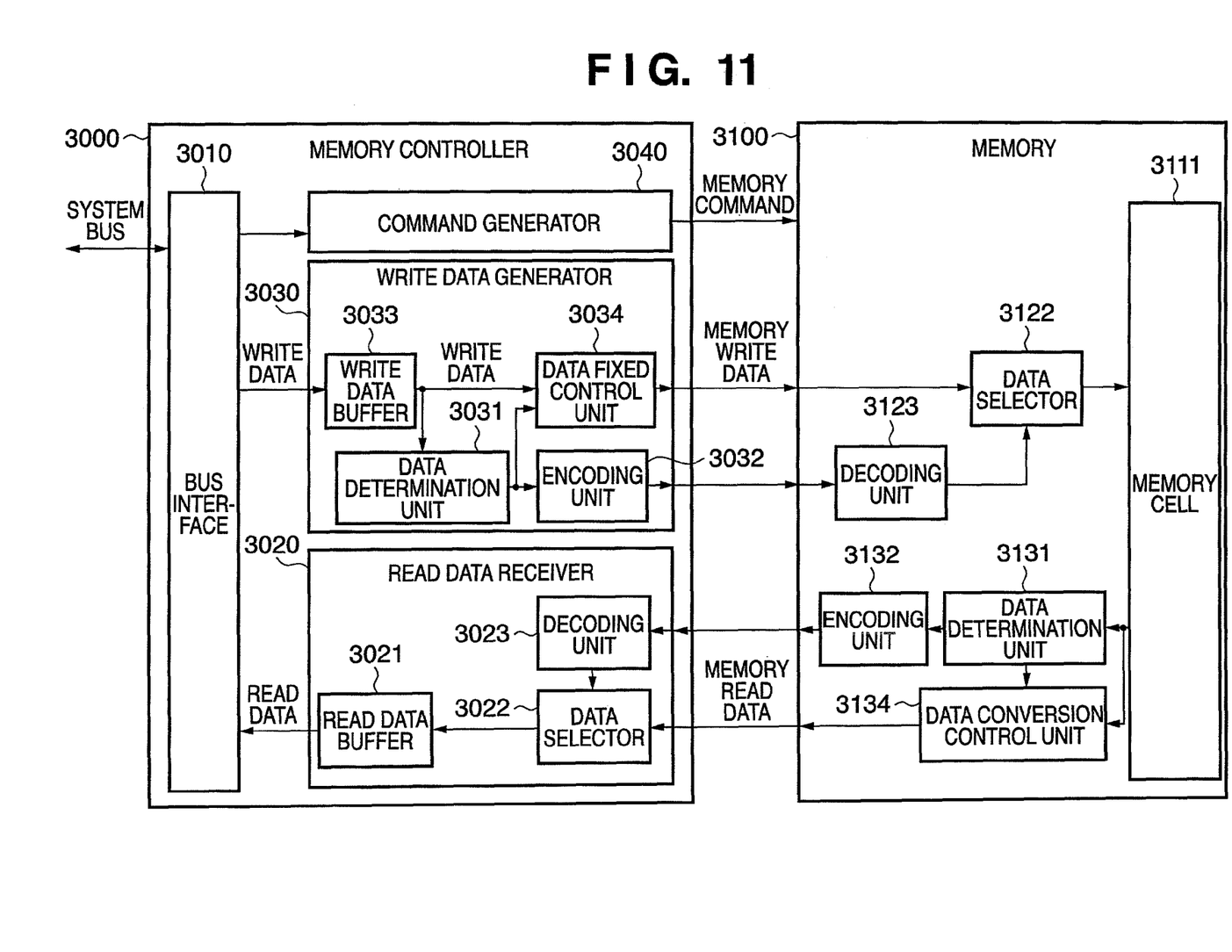
FIG. 11 is a block diagram showing the arrangement of a memory system according to the third embodiment.

FIG. 11 is a block diagram showing the arrangement of a memory system according to an embodiment of the present invention.

In FIG. 11, the same reference numerals as the constituent elements shown in FIG. 5 denote constituent elements given the same names. Reference numeral 3000 denotes a memory controller; and 3100, a memory (memory element) having a memory cell 3111.

A bus interface 3010 connects an internal bus of the memory controller 3000 and a system bus. A read data receiver 3020 outputs data read out from the memory 3100 to the bus interface 3010. A read data buffer 3021 temporarily holds data readout from the memory 3100 and processed, and outputs the data to the bus interface 3010. A data selector 3022 processes data read out from the memory 3100 as explained in the second embodiment. A decoding unit 3023 decodes encoded data output from an encoding unit 3132 of the memory 3100.

A write data generator 3030 temporarily stores write data received from the bus interface 3010 into a write data buffer 3033. After that, the write data generator 3030 performs the same processing as in the second embodiment, and outputs the data to the memory 3100. A data determination unit 3031 analyzes the pattern of data to be written in the memory device 3100, and determines whether the data to be written has a pattern that readily produces noise. An encoding unit 3032 encodes the determination result from the data determination unit 3031, and outputs the encoding result to the memory 3100. If the data determination unit 3031 determines that the data to be written in the memory 3100 readily produces noise, a data fixed control unit 3034 converts the data into data that hardly produces noise. A command generator 3040 generates read and write commands with respect to the memory 3100, and outputs the commands to the memory 3100.

The arrangement of the memory 3100 will be explained below. The memory 3100 has a decoding unit 3123 and data selector 3122 respectively having the same functions as the decoding unit 3023 and data selector 3022 of the memory controller 3000 described above. The memory 3100 also has a data determination unit 3131, encoding unit 3132, and data conversion control unit 3134 respectively having the same functions as the data determination unit 3031, encoding unit 3032, and data fixed control unit 3034 of the memory controller 3000.

Figure 6:
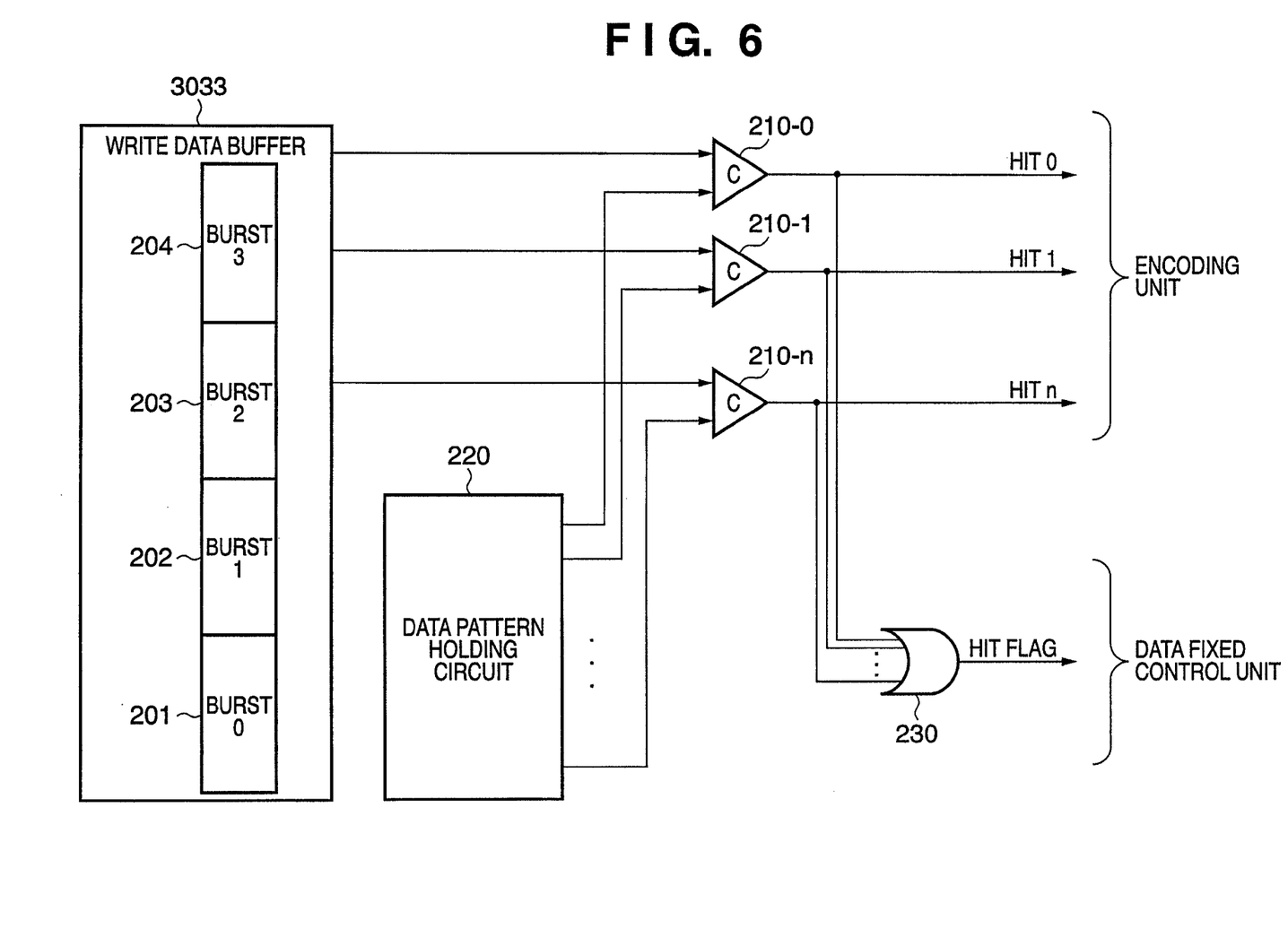
FIG. 6 is a block diagram showing the arrangement of a data determination unit of the second embodiment.

Note that the arrangement of the data determination units 3031 and 3131 according to this embodiment is the same as the data determination unit 3031 shown in FIG. 6. Note also that data patterns held in a data pattern holding circuit 220 and encoding examples of the encoding unit 3032 are the same as shown in FIG. 3. The arrangement of the data selectors 3022 and 3122 according to this embodiment is the same as the data selector 3022 shown in FIG. 9.

In the memory 3100, the decoding unit 3123 receives encoded data encoded and output by the memory controller 3000, and decodes the received data. On the basis of this decoding result, a selection signal 400 to be output to the data selector 3122 is generated. The data selector 3122 selects the write data received from the memory controller 3000 or the pattern data held in a data pattern holding circuit 320 in accordance with the selection signal 400, and outputs the selected data to the memory cell 3111. The memory 3100 holds this output in the memory cell 3111.

More specifically, if the decoding unit 3123 receives, e.g., the above-mentioned code "0010" as the encoded output, the decoding unit 3123 finds that the memory write data is converted into data "0" because this code matches pattern 1. In this case, therefore, the memory 3100 selects pattern 1 stored in the data pattern holding circuit 320 by the selection signal 400, and writes pattern 1 in the memory cell 3111.

On the other hand, if the decoding unit 3123 receives, e.g., the above-mentioned code "0000" as the encoded output, the decoding unit 3123 finds that the memory write data is not converted but directly input to the data selector 3122 because this code does not match any pattern. In this case, therefore, the memory 3100 selects the memory write data by the selection signal 400, and writes the data in the memory cell 3111.

Also, data is read out from the memory 3100 in the order opposite to that of the write operation described above. That is, the data determination unit 3131 determines whether data read out from the memory cell 3111 of the memory 3100 matches any pattern, in the same manner as performed by the memory controller 3000 when writing data. The data determination unit 3131 outputs hit signals 0 to n and hit flags corresponding to the individual patterns. The encoding unit 3132 encodes the signal signals and outputs the encoded signals to the memory controller 3000. In accordance with the determination outputs from the data determination unit 3131, whether the data read out from the memory cell 3111 is actual data or data converted into "0" is determined. The encoding unit 3132 encodes the determination result, and outputs the encoding result to the decoding unit 3023.

The data selector 3022 of the memory controller 3000 receives the output data from the data fixed control nit 3034 of the memory 3100. Also, the decoding unit 3023 of the memory controller 3000 receives the output encoding result from the encoding unit 3132 of the memory 3100. On the basis of the encoding result from the memory 3100, the decoding unit 3023 outputs the selection signal 400. On the basis of the selection signal 400 output from the decoding unit 3023, the data selector 3022 outputs the readout data received from the memory 3100 or the pattern data held in advance in the data pattern holding circuit 320.

In this embodiment as described above, the memory controller 3000 and memory 3100 exchange data by converting data that readily produces noise into data that hardly produces noise. This makes it possible to reduce the number of times of data switching, and suppress noise.

Figure 12A:
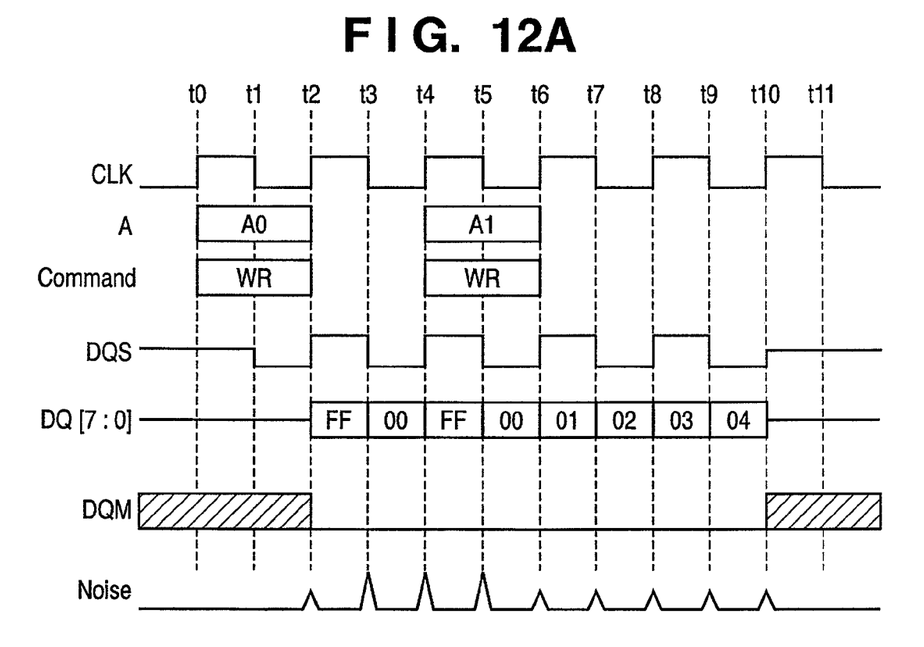
FIGS. 12A and 12B are timing charts for explaining data write according to the third embodiment.
Figure 12B:
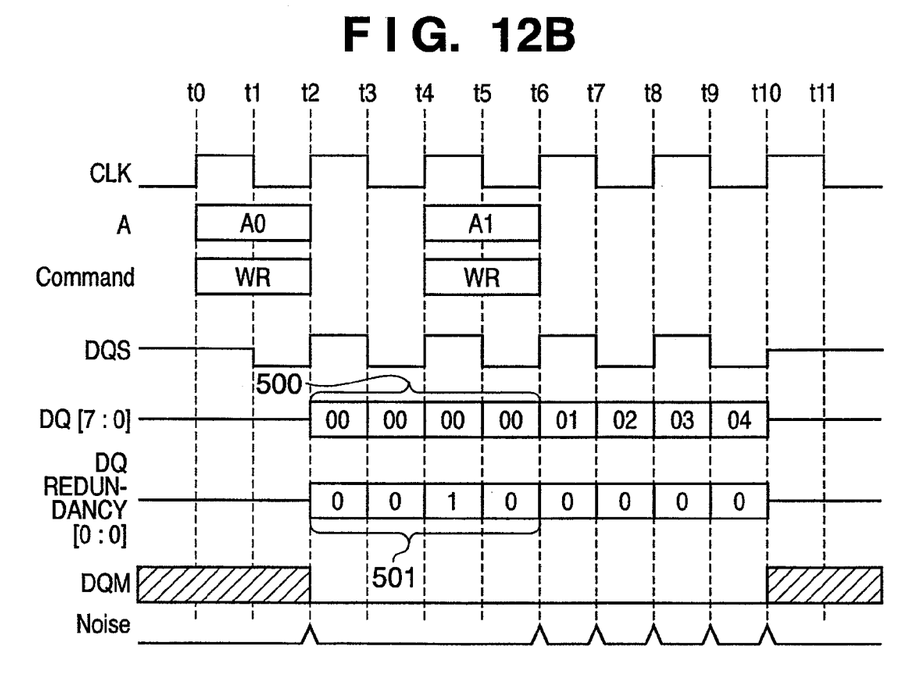

FIG. 12B is a timing chart for explaining data write according to this embodiment in comparison with a comparative example shown in FIG. 12A. In this example, data (00, 00, 00, 00) is written at address "A0", and data (01, 01, 03, 04) is written at address "A1".

In a portion 500, write data (FF, 00, FF, 00) matches pattern 1 and hence is converted into data (00, 00, 00, 00). In this case, the encoding result is "0010" from FIG. 7 (501).

Consequently, noise produced at times t3 to t5 in the comparison example shown in FIG. 12A is reduced to "0".

Note that the pattern data (specific patterns) stored in the data pattern holding circuits 220 and 320 of this embodiment are not limited to the examples described above. That is, it is possible to use any pattern in which the number of bits to be inverted between preceding data and succeeding data is equal to or larger than a predetermined amount. This is so because in a pattern in which the number of bits to be inverted between preceding data and succeeding data is equal to or larger than a predetermined amount, the number of bits that switch between these data increases. As a consequence, an electric current that flows increases, and this increases the possibility of generation of noise.

Also, noise-reduction data is all "0" data in the above embodiments, but any data that reduces the generation of noise can be used.

Other Embodiments According to Present Invention

The means constituting the memory control circuits and the steps of the memory control methods according to the embodiments of the present invention described above can be implemented by the operation of a computer program. The present invention includes this program and a computer-readable recording medium recording the program.

The present invention can also include an embodiment in the form of, e.g., a system, apparatus, method, program, or storage medium.

A program code to be installed in a computer to implement the functional processing of the present invention by the computer also implements the present invention. That is, the present invention includes a computer program itself for implementing the functional processing of the present invention.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2006-237727, filed Sep. 1, 2006, and No. 2006-284141, filed Oct. 18, 2006, which are hereby incorporated by reference herein in their entirety.

What is claimed is:

1. A data output apparatus for outputting data to a memory, comprising:
    a sort unit configured to sort input data in an order corresponding to the input data; and
    a writing unit configured to write, into the memory, the input data sorted by said sort unit and control data for restoring the data sorted by said sort unit to the original sequence the input data was in before the sorting.

2. The apparatus according to claim 1, further comprising a restoration unit configured to read the input data sorted in the sorting step from the memory, and to restore the sorted input data to the original sequence the input data was in before the sorting, on the basis of the control data read out from the memory.

3. A data output method of outputting data to a memory, comprising:
    a sorting step of sorting input data in an order corresponding to the input data; and
    a writing step of writing, into the memory, the input data sorted in the sorting step, and control data for restoring the input data sorted in the sorting step to the original sequence the input data was in before the sorting.

4. The method according to claim 3, further comprising a restoration step of reading the input data sorted in the sorting step from the memory, and restoring the sorted input data to the original sequence the input data was in before the sorting, on the basis of the control data read out from the memory.

5. The apparatus according to claim 1, wherein said sort unit sorts the input data into a plurality of patterns, and selects one pattern of sorted input data from among the plurality of patterns of sorted input data according to a characteristic of the sorted input data, and wherein said writing unit writes, into the memory, the selected sorted input data, and the control data for restoring the input data to the original sequence that the input data was in before the sorting.

6. The method according to claim 3, wherein said sort step sorts the input data into a plurality of patterns, and selects one pattern of sorted input data from among the plurality of patterns of sorted input data according to a characteristic of the sorted input data, and wherein said writing step writes, into the memory, the selected sorted input data and the control data for restoring the input data to the original sequence that the input data was in before the sorting.

7. A memory system having a memory device and memory controller, said memory controller comprising:

a sort unit configured to sort input data in an order corresponding to the input data; and an output unit configured to output, to said memory device, the input data sorted by said sort unit and control data for restoring the input data to the original sequence the input data was in before the sorting, and said memory device comprising:

a write unit configured to write, into a memory cell, the input data sorted by said sort unit and control data for restoring the input data to the original sequence the input data was in before the sorting.

8. The system according to claim 7, wherein said memory controller further comprises a restoration unit configured to read the input sorted by the sorting unit from the memory device, and constructed to restore the sorted input data to the original sequence the input data was in before the sorting, on the basis of the control data read out from the memory device.

9. The system according to claim 7, wherein said sort unit sorts the input data into a plurality of patterns, and selects one pattern of sorted input data from among the plurality of patterns of sorted input data according to a characteristic of the sorted input data, and wherein said writing unit writes, into the memory, the selected sorted input data and the control data for restoring the input data to the original sequence that the input data was in before the sorting.

* * * * *